US006852640B2

(12) United States Patent
Gutsche

(10) Patent No.: US 6,852,640 B2
(45) Date of Patent: Feb. 8, 2005

(54) METHOD FOR FABRICATING A HARD MASK

(75) Inventor: Martin Gutsche, Dorfen (DE)

(73) Assignee: Infineon Technologies AG, Munich (DE)

( * ) Notice: Subject to any disclaimer, the term of this patent is extended or adjusted under 35 U.S.C. 154(b) by 116 days.

(21) Appl. No.: 10/164,549

(22) Filed: Jun. 7, 2002

(65) Prior Publication Data

US 2002/0173163 A1 Nov. 21, 2002

Related U.S. Application Data

(63) Continuation of application No. PCT/DE00/04188, filed on Nov. 24, 2000.

(30) Foreign Application Priority Data

Dec. 7, 1999 (DE) ........................................ 199 58 904

(51) Int. Cl.[7] .............................................. H01L 21/302
(52) U.S. Cl. ....................................... 438/719; 438/700
(58) Field of Search ......................... 438/671, 717–719, 438/735–738

(56) References Cited

U.S. PATENT DOCUMENTS 4,746,630 A 5/1988 Hui et al.
5,298,790 A 3/1994 Harmon et al.
5,928,965 A * 7/1999 Shoji et al. ................. 438/719
6,207,573 B1 * 3/2001 Lee ............................ 438/700

FOREIGN PATENT DOCUMENTS

| | | |
|---|---|---|
| EP | 0 865 079 A2 | 9/1998 |
| EP | 0 932 187 A2 | 7/1999 |
| JP | 60 021 540 | 2/1985 |
| JP | 04 206 820 | 7/1992 |

* cited by examiner

*Primary Examiner*—Dung A. Le
(74) *Attorney, Agent, or Firm*—Laurence A. Greenberg; Werner H. Stemer; Gregory L. Mayback

(57) ABSTRACT

The method is for producing a hard mask on a substrate, and in particular, on a primary area of a semiconductor substrate. The method includes the following steps: forming a first hard mask layer on the substrate; forming at least one additional hard mask layer on the first hard mask layer; structuring the additional hard mask layer in such a way that an area of the first hard mask layer is exposed; and structuring the first hard mask layer while using the additional hard mask layer as a mask so that an area of the substrate is exposed. Additional hard mask layers can be formed on the first hard mask layer. These hard mask layers are successively structured while using at least one overlying hard mask layer as a mask, until the area of the substrate is exposed.

27 Claims, 3 Drawing Sheets

2
3
10

METHOD FOR FABRICATING A HARD MASK

CROSS-REFERENCE TO RELATED APPLICATION

This application is a continuation of copending International Application No. PCT/DE00/04188, filed Nov. 24, 2000, which designated the United States and was not published in English.

BACKGROUND OF THE INVENTION

Field of the Invention

The present invention relates to a method for fabricating a hard mask on a substrate, and in particular to a method for fabricating a hard mask on a main area of a semiconductor substrate.

Although applicable, in principle, to a wide variety of substrate structures, the present invention and the problems on which it is based will be described using a semiconductor substrate.

Hitherto, only a hard mask layer that has been opened directly using a photolithographically patterned resist mask has been used for etching semiconductor substrates.

This mask can no longer be used to etch semiconductor substrates with an extremely high aspect ratio or to pattern materials that are difficult to etch if the mask requires a hard mask thickness that can no longer be opened at all in a single etching step with a photoresist mask.

SUMMARY OF THE INVENTION

It is accordingly an object of the invention to provide a method for fabricating a hard mask on a substrate which overcomes the above-mentioned disadvantages of the prior art methods of this general type.

Therefore, it is an object of the present invention to provide an improved method for fabricating a hard mask having a larger thickness or an increased etching resistance. The method makes it possible to realize etchings that are no longer possible by the application of a simple customary hard mask.

Compared with the known solution approaches, the method has the advantage that etchings of semiconductor substrates with an extremely high aspect ratio or the patterning of materials that are difficult to etch can readily be realized using this hard mask.

The attractiveness of the method described should equally increase as the photoresist thickness decreases further (as the feature size decreases).

The idea underlying the present invention consists in using an n-layered hard mask layer system, where n is a natural number greater than or equal to 2, in order to be able to pattern the target layer or the target layer assembly n+1 by using an etching process, e.g. a dry etching process. In this case, the target layer-is defined as a constituent part of the substrate or may also be the latter itself.

A suitable cascading of hard masks will have to be designed in accordance with the application.

In accordance with one preferred development, the patterning of adjacent hard mask layers is carried out by using two different etching processes which make it possible to etch a further hard mask layer with a specific selectivity with respect to the first hard mask layer and also to etch the first hard mask layer with high selectivity with respect to the further hard mask layer.

In accordance with a further preferred development, the patterning of the further hard mask layer is carried out using a photoresist mask.

In accordance with a further preferred development, the photoresist mask is removed after the patterning of the further hard mask layer.

In accordance with a further preferred development, after the substrate has been uncovered, a remainder of the further hard mask layer remains on the first hard mask layer.

In accordance with a further preferred development, a plurality of further hard mask layers are formed on the first hard mask layer, which are patterned progressively using at least one overlying hard mask layer as mask until the region of the substrate is uncovered.

In accordance with a further preferred development, the patterning of adjacent hard mask layers is carried out by using two different etching processes that make it possible to etch the upper hard mask layer with a specific selectivity with respect to the lower hard mask layer and also to etch the lower hard mask layer with a high selectivity (i.e. preferentially) with respect to the upper hard mask layer.

In accordance with a further preferred development, the patterning of the topmost hard mask layer is carried out using a photoresist mask.

In accordance with a further preferred development, the photoresist mask is removed after the patterning of the topmost hard mask layer.

In accordance with a further preferred development, after the substrate has been uncovered, a remainder of the second-lowest hard mask layer remains on the bottommost hard mask layer.

In accordance with a further preferred development, hard mask layers of two different types are formed alternately.

In accordance with a further preferred development, at least two underlying hard mask layers are simultaneously opened with at least one hard mask layer.

In accordance with a further preferred development, the two materials of the hard mask layers are selected from the following pairs: Si—$SiO_2$; Si—SiN; $SiO_2$—SiN; $SiO_2$—Al.

In accordance with a further preferred development, the materials of the hard mask layers are selected from the following: silicon, in particular α-Si, poly-Si; silicon oxides, in particular SiO, $SiO_2$; borosilicate glass BSG, borophosphorus silicate glass BPSG; flowable oxide FOX, . . . ; SiN; $SiO_xN_y$; W; WSi; Ti; TiN; TiSi; Al; Cu; Ta; TaN; polyimides; photoresists; and metal oxides, in particular $Al_2O_3$, $TiO_2$, $Ta_2O_5$.

In accordance with a further preferred development, a thin barrier layer is formed between two adjacent hard mask layers and/or between the substrate and the first hard mask layer (typically ≦10% of the thickness of the hard mask layer), which barrier layers are likewise patterned during etching.

In accordance with a further preferred development, the method is applied during contact hole etching or during deep trench etching or during etching of nonvolatile materials, such as e.g. Pt, Ir or the like.

In accordance with a further preferred development, in this application, the hard mask layers are constructed as follows: oxide-X-oxide-X . . . , in particular oxide-X or oxide-X-oxide, where X=silicon, in particular α-Si, poly-Si; SiN; Al; $Al_2O_3$; or oxide-X where X=A-B=Si—$SiO_2$; Si—SiN; Si—$Al_2O_3$; SiN—$SiO_2$; Al—$SiO_2$; Al—SiN; Al—SiON (first-mentioned material in each case at the very bottom).

With the foregoing and other objects in view there is provided, in accordance with the invention, a method for fabricating a hard mask on a substrate. The method includes steps of:

a) forming a first hard mask layer on the substrate;

b) creating a stack by forming a plurality of further hard mask layers on the first hard mask layer, the stack having a property that increases toward the substrate, the property selected from the group consisting of a thickness and an etching resistance;

c) progressively patterning all, except a top one, of the plurality of the further hard mask layers using at least one overlying one of the further hard mask layers as a mask; and d) patterning the first hard mask layer using at least one of the plurality of the further hard mask layers as a mask such that a region of the substrate is uncovered.

In accordance with an added feature of the invention, the hard mask is used for etching a target layer, multiple target layers, or the substrate.

In accordance with an additional feature of the invention, the hard mask is used for performing a contact hole etching, a deep trench etching, or an etching of a nonvolatile material.

In accordance with another feature of the invention, the hard mask is used for patterning an electrode structure required for a stacked capacitor when etching with a high aspect ratio in either polysilicon or $SiO_2$.

Exemplary embodiments of the present invention are represented in the drawings and explained in more detail in the description below.

Other features which are considered as characteristic for the invention are set forth in the appended claims.

Although the invention is illustrated and described herein as embodied in a method for fabricating a hard mask, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
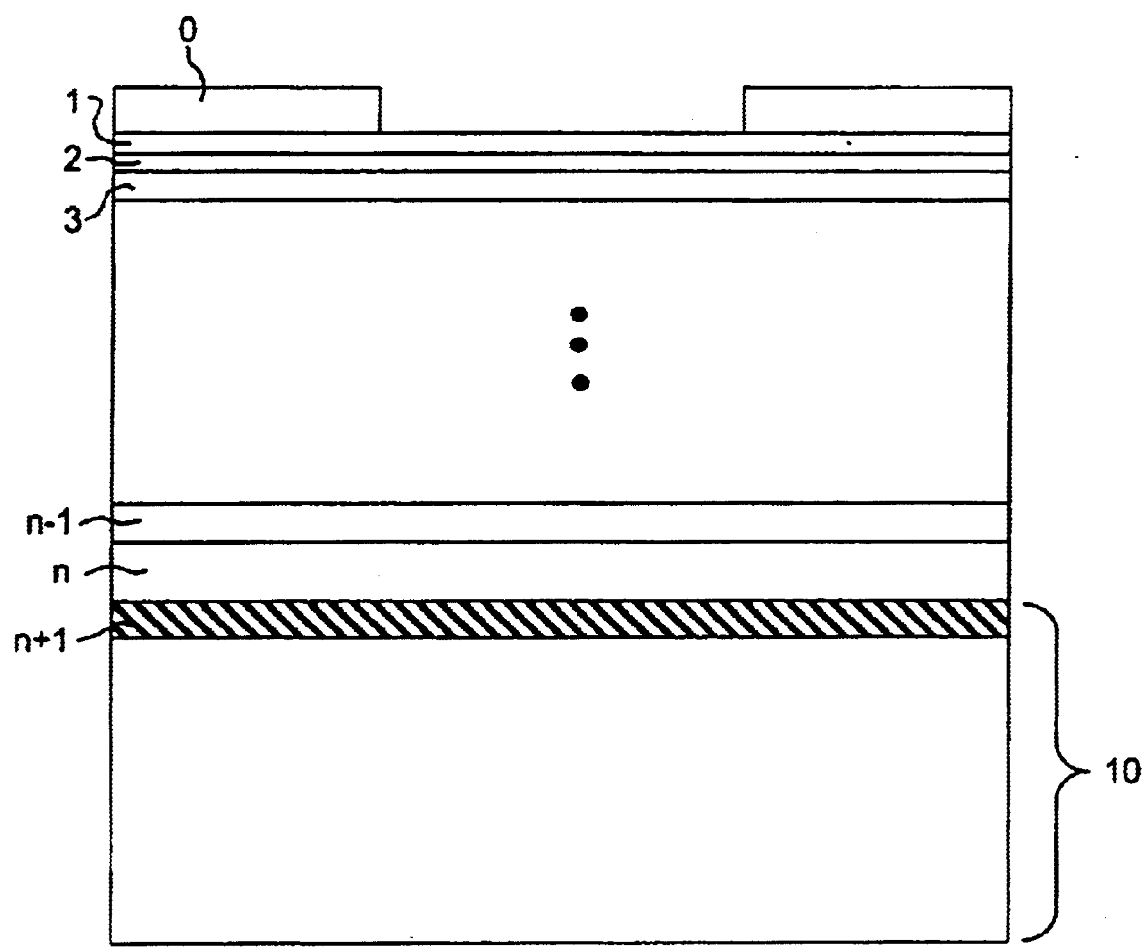
FIG. 1 is a diagrammatic representation of a semiconductor substrate with a stack including n hard mask layers for illustrating an embodiment of the method.

In the figures, identical reference symbols designate identical or functionally identical elements. Referring now to the figures of the drawing in detail and first, particularly, to FIG. 1 thereof, there is shown a diagrammatic representation of a semiconductor substrate with a stack including n hard mask layers with downwardly increasing thickness or etching resistance for illustrating one embodiment of the inventive method.

In FIG. 1, reference symbol 10 designates a semiconductor substrate with a layer n+1 to be etched using the hard mask. This layer, by definition, belongs to the substrate 10 or is the substrate itself. Provided above that are hard mask layers n, n−1, . . . , 3, 2, 1 having a respective thickness $d_i$ (i=1, . . . , n) and also an already patterned photoresist layer 0 having the thickness $d_0$. The photoresist layer 0 is applied to the topmost hard mask layer 1 having the thickness $d_1$.

Using a suitable etching method, the hard mask layer 1 is opened and then the photoresist is preferably, but not necessarily, removed. The hard mask layer 1 then serves as a hard mask during the etching of the hard mask layer 2, in which case a remainder of the hard mask layer 1 preferably, but not necessarily, remains on the hard mask layer 2. The hard mask layer 3 is then patterned using the hard mask layer 2 and so on and so forth.

Given a choice of suitable hard mask materials and thicknesses and corresponding etching processes with suitable etching selectivities, it is possible, by using a thin photoresist mask and a relatively thin hard mask layer 1, to produce a hard mask layer n having any desired thickness or any desired etching resistance. This hard mask layer n can then ultimately serve, together with a hard mask layer n−1 that may be present and that has not been entirely used up, as a hard mask for etching the target layer n+1 or the substrate.

The following symbols are used for the quantitative consideration:

$d_i$ the initial thickness of the layer I;

$ER_{p,i}$ the etching rate of the material of the layer i during the etching of the layer p (etching process p);

$S_{p,ij}=ER_{p,i}/ER_{p,j}$ the selectivity of layer i with respect to layer j during etching of the mask layer p;

$f_{ue,i}$ the proportion of the layer i that remains as a remainder of the layer i after opening the layer i+1; and $f_{oe,\,i}$ the overetching contribution relative to layer thickness $d_i$ during etching of the layer I;

For given etching rates $ER_{p,i}$ and selectivities $S_{p,ij}$ and for specific required overetching factors $f_{oe,i}$ and residual layer thickness factors $f_{ue,i}$, it is possible to derive the following formulae between the layer thicknesses of the hard mask films. Using these formulae, the obtainable mask thicknesses $d_i$ and hence $d_n$ and also the achievable etching depth $d_{n+1}$ in the target layer n+1 can be calculated iteratively for given starting thicknesses $d_0$, $d_1$. For given thicknesses $d_n$ and/or $d_{n+1}$ it is possible to determine the required initial thicknesses of the topmost hard mask $d_1$ or of the photoresist mask $d_0$.

$$d_{i+1}=S_{i+1,\,i+1\,i}\,F_i\,d_i+S_{i+1,\,i+1\,i-1}\,G_{i-1}\,d_{i-1} \quad (1)$$

where $$F_1=[1-f_{ue,i}+(S_{i,\,i+1\,i}/S_{i+1,\,i+1\,i})f_{oe,i}]/[1+f_{oe,\,i+1}]$$

$$G_{i-1}=f_{ue,\,i-1}/[1+f_{oe,\,i+1}]$$

If the overetching factors $f_{oe,i}$ and residual layer thickness factors $f_{ue,i}$ are disregarded, then the following simple expression is produced for the etching depth $d_{n+1}$ of the target layer:

$$d_{n+1}=S_{n+1,\,n+1\,n}\,S_{n,\,n\,n-1},\,S_{n-1,\,n-1\,n-2}\,\ldots\,S_{2,\,21}\,S_{1,\,10}\,d_0 \quad (2)$$

Appropriate mask materials are, in particular, all customary materials used in the semiconductor industry, such as Si (α-Si, poly-Si), silicon oxides (SiO, $SiO_2$, BSG, BPSG, FOX, . . . ), SiN $SiO_xN_y$, W, WSi, Ti, TiN, TiSi, Al, Cu, Ta, TaN, polyimides and photoresists, but also oxides, such as, for instance, $Al_2O_3$, $TiO_2$, $Ta_2O_5$, etc.

FIGS. 2*a–e* show a stack including two hard mask layers in order to illustrate the essential method steps of a further embodiment of the inventive method.

If, by way of example, the remainder of the photoresist mask is removed after etching the layer 1, the required layer thickness $d_1$ that is obtained using the above formula (1) in the case of such a two-layered hard mask for a given $d_2$ is as follows:

$$d_1=[d_2/S_{2,21}]\times[1+f_{oe,2}]/[1-f_{ue,1}+(S_{1,21}/S_{2,21})f_{oe,1}].$$

Figure 2A:
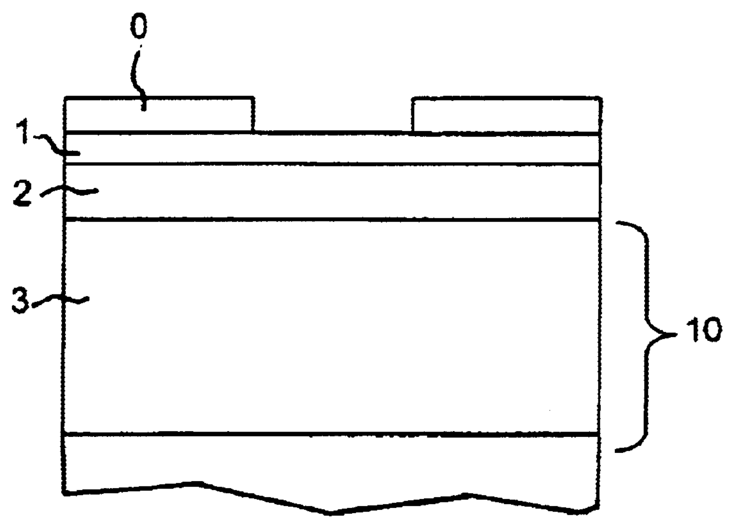
FIGS. 2A–2E show the essential method steps of a further embodiment of the method with a stack including two hard mask layers.

In accordance with FIG. 2*a*, first a stack of the hard mask layers 1, 2 and the lithographically patterned photoresist layer 0 is provided on the substrate 10 having the layer 3 to be etched. In this case the layer 3 may be defined as belonging to the substrate 10 or may embody the substrate itself.

Figure 2B:
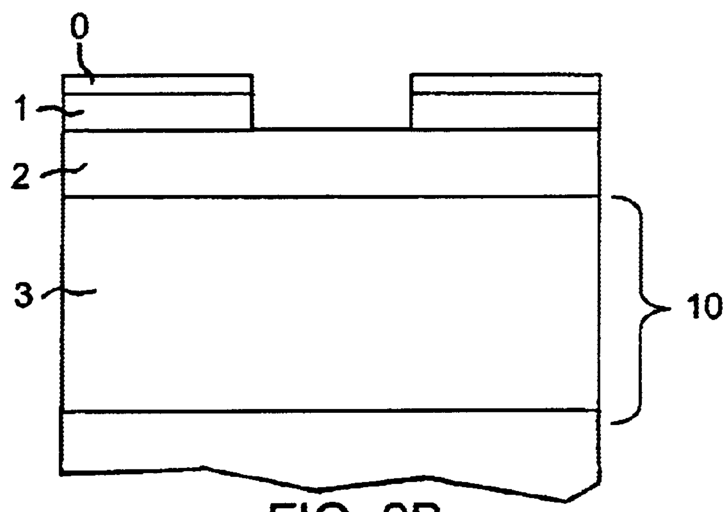

The photoresist layer 0 is then patterned in accordance with FIG. 2*b* to form a mask that is used, in turn, to pattern the hard mask layer 1 in such a way that a region of the lower hard mask layer 2 is uncovered. The hard mask layer 2, as indicated in FIG. 2*b*, is only slightly incipiently etched.

Figure 2C:
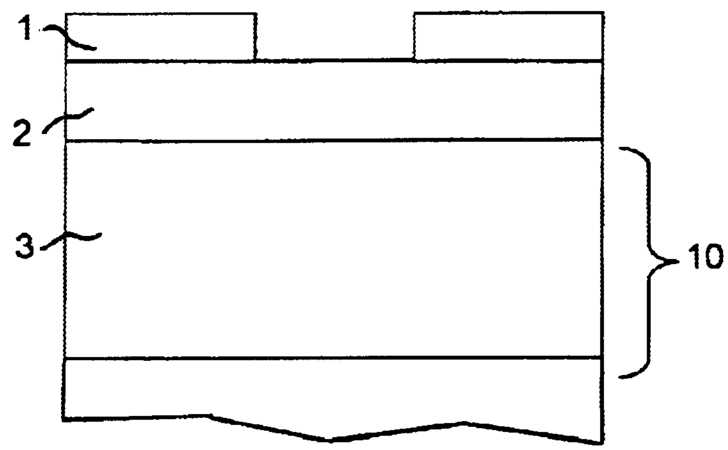

The photoresist mask 0 is subsequently removed in accordance with FIG. 2*c*.

Figure 2D:
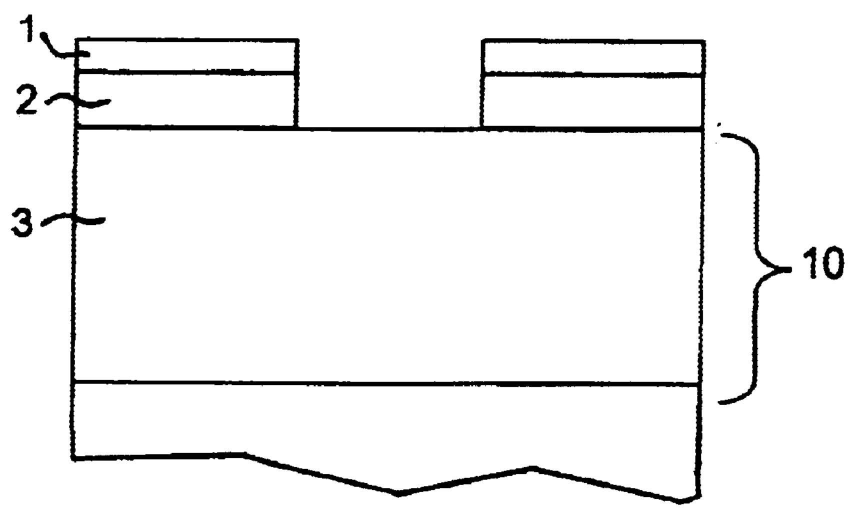
Figure 2E:
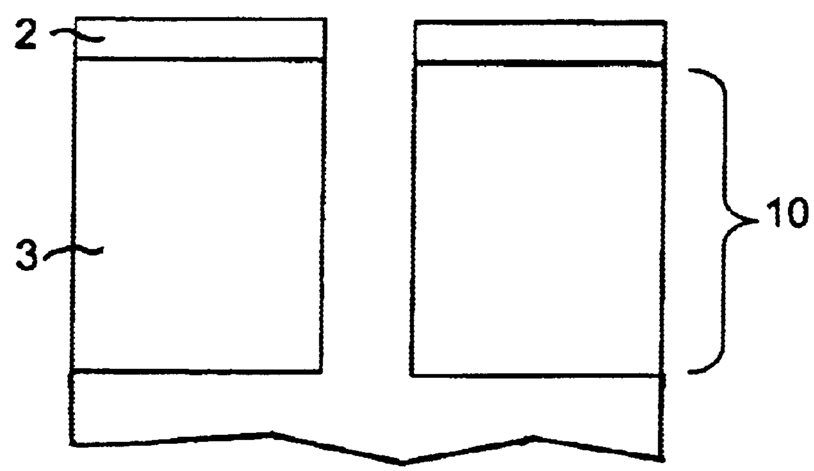

In a further step in accordance with FIG. 2*d*, the lower hard mask layer 2 is patterned using the upper hard mask layer 1 as a mask such that a region of the substrate 10 is uncovered.

In this case, the patterning of the lower hard mask layer 2 is carried out by an etching process that has a high selectivity with respect to the upper hard mask layer 1. Finally, the substrate 10 is etched using a hard mask formed by the hard mask layer 2 and the hard mask layer 1, which has only partly been used up or etched away, in order thus to form a deep trench, for example.

During the etching of the substrate 10, depending on the choice of the mask material 1 and/or in a manner dependent on the substrate etching process, the remainder of the hard mask layer 1 can function as a hard mask only during part of the substrate etching (e.g. when penetrating through a target layer 3 before the rest of the substrate is etched using the hard mask layer 2 as hard mask). Alternatively, during the etching of the substrate 10, depending on the choice of the mask material 1 and/or in a manner dependent on the substrate etching process, the remainder of the hard mask layer 1 can generally function only briefly as a hard mask (until the remainder of the hard mask layer 1 has been used up and the hard mask layer 2 takes over the function of the hard mask for the substantial part of the substrate etching). Alternatively, during the etching of the substrate 10, depending on the choice of the mask material 1 and/or in a manner dependent on the substrate etching process, the remainder of the hard mask layer 1 will not function explicitly as a hard mask at all (if the substrate etching process does not have an increased selectivity with respect to the hard mask material 1 and only hard mask layer 2 is intended to serve as hard mask).

A few further embodiments will additionally be mentioned by way of example below.

It is particularly expedient to effect the alternate deposition of two complementary materials X and Y to form a layer assembly with the sequence . . . XYXYXY . . . (at least XY in accordance with FIG. 2). For X and Y, at least two etching processes exist which make it possible both to etch the layer X selectively with respect to the layer Y and to etch the layer Y selectively with respect to the layer X. The following pairings are conceivable, for example: silicon oxide-SiN (where SiO is an example of various silicon oxides: thus, BSG-SiN would also be conceivable), silicon-$SiO_2$ and silicon-SiN, where silicon here represents α-Si and poly-Si. This would then give a multilayer hard mask of the form SiN—$SiO_2$—SiN—. . . (or $SiO_2$—SiN—. . . ) or of the form . . . —Si—$SiO_2$— . . . or of the form Si—SiN—. . . .

By the alternate application of selective etchings, using thin photoresist masks, it is possible to pattern relatively thick hard masks and thus to realize high aspect ratios in the target layer or in the substrate.

A conceivable application is e.g. deep trench etching during DRAM (Dynamic Random Access Memory) fabrication. Hitherto, a simple oxide mask has been used in this case, often a pad nitride and an oxidized Si surface additionally lies between the oxide mask and substrate.

In this case, using a hard mask cascade including at least 2 hard mask layers XY, it would be possible to obtain an increase in the etching depth in silicon and thus an increase in the capacitor capacitance. By way of example, an SiN or Si or alternatively, for instance, an Al or $Al_2O_3$ mask layer could thus be positioned above the oxide mask already present. This mask layer would make it possible to open the thick oxide mask required for achieving high trench aspect ratios.

A multilayer hard mask would likewise be attractive also for patterning materials that are difficult to etch, such as e.g. Pt or Ir, as are required for the electrodes of a stacked capacitor. In a Pt etching process that is currently undergoing intensive investigation, the selectivity of Pt:$SiO_2$ is about 1:3. Consequently, 750 nm of $SiO_2$ are necessary in order to etch only 250 nm of Pt. It can be seen that Pt electrode heights of 400–700 nm are required for a minimum feature size of 100 nm. $SiO_2$ hard mask heights of between 1200 nm and 2100 nm would then be necessary. The use of the hard mask cascade described above can provide a remedy here, too. There might possibly also be required a further ARC layer (ARC stands for Anti Reflection Coating) between the photoresist mask and the topmost hard mask layer and/or an additional barrier layer (e.g. TiN, TaSiN, etc.) between Pt and the bottommost hard mask layer.

In certain cases, it may also be necessary to position additional thin barrier layers between the hard mask layers X and Y. The combination Al—$SiO_2$ shall be mentioned as an example. Al can be etched excellently e.g. in chlorine-containing plasmas, while it can be removed only at a low rate in fluorine-containing plasmas. The situation is exactly reversed in the case of $SiO_2$. Hard mask cascades including . . . Al—$SiO_2$—Al—$SiO_2$ . . . are thus possible. However, it may be expedient to deposit thin TiN and/or Ti layers between $SiO_2$ and Al.

Although the present invention has been described above using preferred exemplary embodiments, it is not restricted thereto, but rather can be modified in diverse ways.

I claim:

1. A method for fabricating a hard mask on a substrate, the method which comprises:

a) forming a first hard mask layer on the substrate;

b) creating a stack by forming a plurality of further hard mask layers on the first hard mask layer, the stack having a property that increases toward the substrate, the property selected from the group consisting of a thickness and an etching resistance;

c) progressively patterning all, except a top hard mask layer of the plurality of the further hard mask layers using at least one overlying one of the further hard mask layers as a mask; and d) patterning the first hard mask layer using at least one of the plurality of the further hard mask layers as a mask such that a region of the substrate is uncovered.

2. The method according to claim 1, which comprises:

patterning adjacent hard mask layers using two different etching processes that make it possible to etch one of the further hard mask layers with a specific selectivity with respect to the first hard mask layer and also to etch the first hard mask layer with a high selectivity with respect to the one of the further hard mask layers.

3. The method according to claim 1, which comprises:

using a photoresist mask to pattern the top hard mask layer of the plurality of the further hard mask layers.

4. The method according to claim 3, which comprises:

providing a thin antireflection layer between the photoresist mask and the top hard mask layer of the plurality of the further hard mask layers.

5. The method according to claim 3, which comprises:

removing the photoresist mask after the top hard mask layer of the plurality of the further hard mask layers has been patterned.

6. The method according to claim 1, which comprises:

after the substrate has been uncovered, leaving a remainder of at least one of the plurality of the further hard mask layers on the first hard mask layer.

7. The method according to claim 6, which comprises:

patterning adjacent ones of the plurality of the further hard mask layers using two different etching processes that make it possible to etch an upper hard mask layer with a specific selectivity with respect to a lower hard mask layer and also to etch the lower hard mask layer with high selectivity with respect to the upper hard mask layer.

8. The method according to claim 6, which comprises:

using a photoresist mask to pattern the top hard mask layer of the plurality of the further hard mask layers.

9. The method according to claim 8, which comprises:

providing a thin antereflection layer between the photoresist mask and the top hard mask layer of the plurality of the further hard mask layers.

10. The method according to claim 8, which comprises:

removing the photoresist mask after patterning the top hard mask layer of the plurality of the further hard mask layers.

11. The method according to claim 6, which comprises:

after the substrate has been uncovered, leaving a remainder of the lowest one of the plurality of the further hard mask layers on the first hard mask layer.

12. The method according to claim 6, wherein:

the plurality of the further hard mask layers include two different types of mask layers that are formed alternately.

13. The method according to claim 12, wherein:

the two different types of mask layers form a material pair selected from the group consisting of: Si—$SiO_2$; Si—SiN; $SiO_2$—SiN; and $SiO_2$—Al.

14. The method according to claim 6, wherein:

at least two underlying hard mask layers, selected from the group consisting of the first hard mask layer and the plurality of the further hard mask layers, are simultaneously opened with at least one of the plurality of the further hard mask layers.

15. The method according to claim 1, wherein:

the first hard mask layer and the plurality of the further hard mask layers include materials selected from the group consisting of silicon, silicon oxide, a borosilicate glass, a borophosphorus silicate glass, a flowable oxide, SiN, $SiO_xN_y$, W, Wsi, Ti, TiN, TiSi, Al, Cu, Ta, TaN, a polyimide, a photoresist, and a metal oxide.

16. The method according to claim 15, wherein:

the silicon is selected from the group consisting of α-Si and poly-Si;

the silicon oxide is selected from the group consisting of SiO and $SiO_2$; and the metal oxide is $Al_2O_3$.

17. The method according to claim 1, which comprises: forming a thin barrier layer between two adjacent layers selected from the group consisting of the first hard mask layer and the plurality of the further hard mask layers.

18. The method according to claim 1, which comprises: forming a thin barrier layer between the first hard mask layer and the substrate.

19. A method for fabricating and using a hard mask, the method which comprises:

fabricating the hard mask on a substrate by:

forming a first hard mask layer on the substrate, creating a stack by forming a plurality of further hard mask layers on the first hard mask layer, the stack having a property that increases toward the substrate, the property selected from the group consisting of a thickness and an etching resistance, progressively patterning all, except a top hard mask layer of the plurality of the further hard mask layers using at least one overlying one of the further hard mask layers as a mask, and patterning the first hard mask layer using at least one of the plurality of the further hard mask layers as a mask such that a region of the substrate is uncovered; and using the hard mask for etching a structure selected from the group consisting of a target layer, multiple target layers, and the substrate.

20. The method according to claim 19, wherein: the structure includes a material selected from the group consisting of Si, $SiO_2$, and SiN.

21. A method for fabricating and using a hard mask, the method which comprises:

fabricating the hard mask on a substrate by:

forming a first hard mask layer on the substrate, creating a stack by forming a plurality of further hard mask layers on the first hard mask layer, the stack having a property that increases toward the substrate, the property selected from the group consisting of a thickness and an etching resistance, progressively patterning all, except a top hard mask layer of the plurality of the further hard mask layers using at least one overlying one of the further hard mask layers as a mask, and patterning the first hard mask layer using at least one of the plurality of the further hard mask layers as a mask such that a region of the substrate is uncovered; and using the hard mask for performing an etching selected from the group consisting of a contact hole etching, a deep trench etching, and an etching of a nonvolatile material.

22. The method according to claim 21, wherein the nonvolatile material is selected from the group consisting of platinum and iridium.

23. The method according to claim 21, wherein:

the first hard mask layer and the plurality of the further hard mask layers are constructed in a manner selected from the group consisting of: oxide-X-oxide-X . . . , where X is selected from the group consisting of silicon, SiN, Al, and $Al_2O_3$; and oxide-X, where X=A-B is selected from the group consisting of Si—$SiO_2$, Si—SiN, Si—$Al_2O_3$, SiN—$SiO_2$, Al—SiO, Al—SiN, and Al—SiON, where oxide or $SiO_2$ also represent BSG, BPSG, TEOS, FOX, SOG and the like.

24. The method according to claim 23, wherein the silicon is selected from the group consisting of α-Si and poly-Si.

25. The method according to claim 23, wherein:

the first hard mask layer and the plurality of the further hard mask layers are constructed in a manner selected from the group consisting of: oxide-X-oxide, where X is selected from the group consisting of silicon, SiN, Al, and $Al_2O_3$; and oxide-X where X=A-B is selected from the group consisting of Si—$SiO_2$, Si—SiN, Si—$Al_2O_3$, SiN—$SiO_2$, Al—$SiO_2$, Al—SiN, and Al—SiON, where oxide or $SiO_2$ also represent BSG, BPSG, TEOS, FOX, SOG and the like.

26. The method according to claim 25, wherein the silicon is selected from the group consisting of α-Si and poly-Si.

27. A method for fabricating and using a hard mask, the method which comprises:

fabricating the hard mask on a substrate by:

forming a first hard mask layer on the substrate, creating a stack by forming a plurality of further hard mask layers on the first hard mask layer, the stack having a property that increases toward the substrate, the property selected from the group consisting of a thickness and an etching resistance, progressively patterning all, except a top hard mask layer of the plurality of the further hard mask layers using at least one overlying one of the further hard mask layers as a mask, and patterning the first hard mask layer using at least one of the plurality of the further hard mask layers as a mask such that a region of the substrate is uncovered; and using the hard mask for patterning an electrode structure required for a stacked capacitor when etching with a high aspect ratio in a material selected from the group consisting of polysilicon and $SiO_2$.

* * * * *